United States Patent [19]

Faillace

[11] Patent Number: 4,961,256

[45] Date of Patent: Oct. 9, 1990

[54] EXTRACTION TOOL

[75] Inventor: Nicholas J. Faillace, Lutherville, Md.

[73] Assignee: Westinghouse Electric Corp., Pittsburgh, Pa.

[21] Appl. No.: 417,628

[22] Filed: Oct. 5, 1989

[51] Int. Cl.⁵ ............................................. H05K 13/04
[52] U.S. Cl. .......................................... 29/764; 29/267
[58] Field of Search ................. 29/764, 762, 267, 270, 29/239; 81/485

[56] References Cited

U.S. PATENT DOCUMENTS

| | | | |
|---|---|---|---|
| 3,626,575 | 12/1971 | Greenspan | 29/764 |
| 3,680,838 | 8/1972 | Dunn | 29/267 X |
| 4,519,130 | 5/1985 | Schaefer | 29/764 |
| 4,805,298 | 2/1989 | Takahashi | 29/764 |

Primary Examiner—Carl E. Hall
Attorney, Agent, or Firm—J. K. Williamson

[57] ABSTRACT

An extraction tool is inserted between an electrical connector and an electrical device by which it is held for extracting the connector without rocking or substantially bending electrical contacts extending between them. The tool has a lever arm and an object-contacting arm. A pivot is adjacent the lever arm and the object-contacting arm for pivoting the tool about the electrical device. The distal end of the object-contacting arm is convexly contoured for slidably contacting the connector while the pivot is in contact with the electrical device. Preferably the tool has multiple spaced apart object-contacting arms and pivots for linearly extracting the connector from the device without bending their connections.

7 Claims, 3 Drawing Sheets

EXTRACTION TOOL

BACKGROUND OF THE INVENTION

This invention relates to an extraction tool for extracting a tangible object from a device which holds the object.

This invention is particularly useful for extracting tangible objects such as cable connectors and other electrical connectors having multiple contacts from devices such as other cable connectors, shorting caps and other electrical apparatus. These tangible objects are frequently tightly held by several spaced contacts which usually require a great amount of applied force to extract an object from a device. Their separation is normally accomplished by manually rocking the object by hand (or perhaps with a prying tool) as the object is pulled away from the device. This rocking inevitably bends the contacts and damages the object and/or the device.

Thus it is an object of the present invention to extract a tangible object from a device by which it is held without rocking it. It is a further object of the invention to linearly extract a tangible object without bending the contacts.

SUMMARY OF THE INVENTION

With these objects in view, the present ivention resides in an extraction tool which may be inserted between a device and a tangible object held by the device for employing lever action to reduce the required extracting force. The tool generally has a lever arm with a first end and a distal end. An object-contacting arm has a first end and a distal end. The first ends of the lever arms and the object-contacting arm are adjacent to each other and to a pibot for pivotally contacting a device holding an object. The object-contacting member extends from its first end ot the distal end which has a convexly contoured portion adapted to be in contact with the object while the pivot is in pivotal contact with the device. Thus there is sliding contact between the object and the tool for applying a force without a rocking action.

In a preferred embodiment of the invention, there are at least two object-contacting arms for contacting at least two spaced points of an object for linearly extracting the object. In addition, a handle member preferably extends transversely between two lever arms for applying an extraction force between two pivots and thereby applying generally balanced extraction forces to the object. Also, the transverse handle member conveniently permits a technician to apply an extraction force with his wrist parallel to a line extending between the pivots for efficiently applying an extracting force.

DESCRIPTION OF THE DRAWINGS

The invention will become more readily apparent from the following description of a preferred embodiment thereof shown, by way of example only, in the accompanying drawings, wherein.

DESCRIPTION OF A PREFERRED EMBODIMENT

Figure 2:
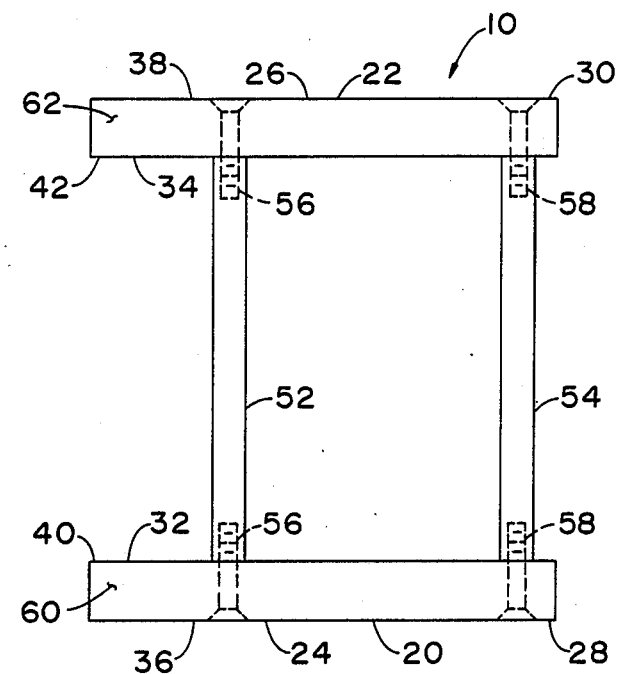
FIG. 2 is a plan view of the extraction tool of FIG. 1 taken along line II—II of FIG. 1.
Figure 1:
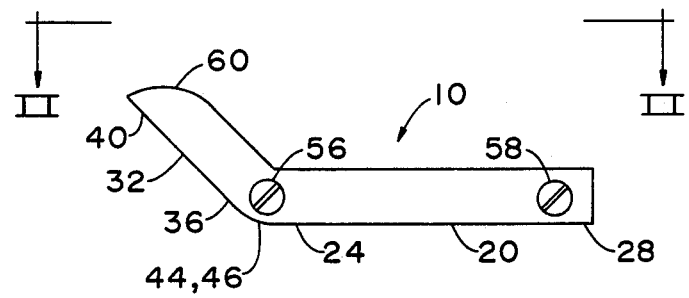
FIG. 1 is a front elevational view of an extraction tool embodying the present invention.
Figure 3:
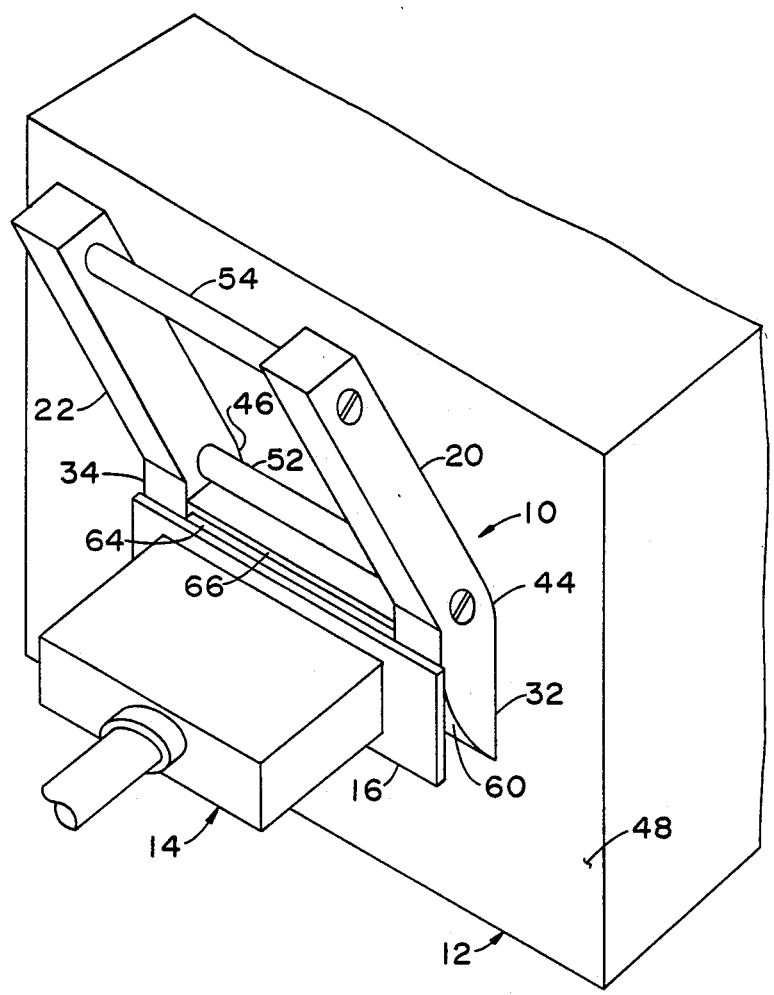
FIG. 3 is a perspective view of an extraction tool of FIG. 1 inserted between and object and a device.
Figure 4:
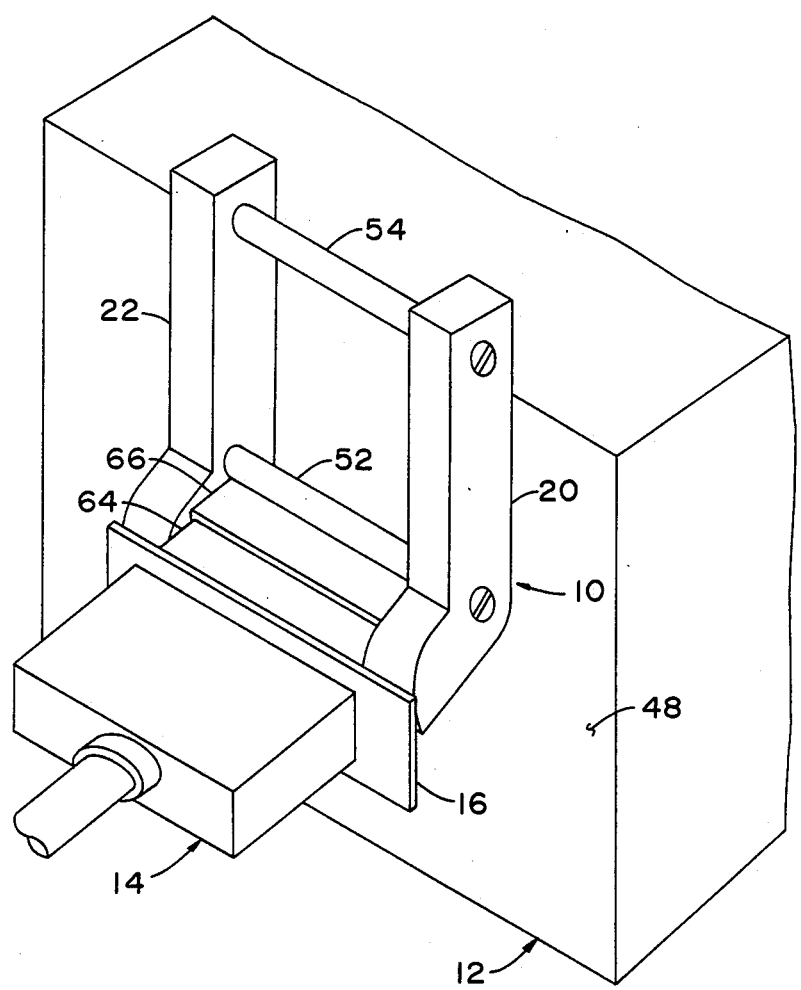
FIG. 4 is a perspective view like FIG. 3 which shows the extraction tool and the object after the extraction tool has been pivoted.

FIGS. 1 and 2 generally show an extraction tool 10 which is adapted to be inserted between a device and a tangible object held by the device, such as the electrical device 12 and the cable connector 14 having a flange 16 shown in FIGS. 3 and 4. The device also could be a shorting cap, another cable connector or other electrical device which has one or more contacts with the object. Also, the tangible object could be a shorting cap or an electrical device. In addition, the object and device need not be electrically connected, but may be merely mechanically connected by one or more contacts extending between them.

The extractor tool 10 shown in FIGS. 1 to 4 generally has two interconnected spaced apart parallel lever arms 20, 22 having first ends 24, 26 and distal ends 28, 30, and object-contacting arms 32, 34 having first ends 36, 38 and distal object-contacting ends 40, 42. Pivots 44, 46 are adjacent the first ends 24, 26 of the lever arms 20, 22 and the first ends 36, 38 of the object-contacting arms 32, 34 for pivotally contacting a side 48 of the electrical device 12. Preferably the pivots 44, 46 are, but need not be, curved as shown. A cross member 52 extends along a line between the lever arms 20, 22 adjacent the pivots 44, 46 for maintaining the object-contacting arms 32, 34 in stable parallel spaced apart relationship. In othe embodiments of the invention (not shown), the cross member 51 may also function as a pivoting means along its length either with or in place of the pivots 44, 46 shown in the drawings depending upon its relative dimension. Also the cross member may have any suitable shape. A handle member 54 extends between the distal ends 28, 30 of the lever arms 20, 22 for providing a means of conveniently applying extraction forces between the pivots 44, 46. Thus a technician may push or pull on the handle member 54 with his (or her) wrist transverse to and between the pivots 44, 46. Screws 56, 58 or other suitable attachment means may be employed to attach the cross member 52 and the handle member 54 to the lever arms 20, 22. Such attachment means are not required if the tool is constructed of one piece.

The distal ends 40, 42 of the object-contacting arms 32, 34 have convexly contoured portions 60, 62 for contacting the connector 14, which may be curved surfaces as shown or (in other embodiments) curved edges. The convexly contoured portions 60, 62 may not be continuously curved but may alternatively comprise a series of chords of one or more convex curves or surfaces. The convexly contoured portions 60, 62 permit sliding contact of the tool 10 with the flange 16 of the connector 14 shown in FIGS. 3 and 4 so that there is no rocking or bending. Preferably the convexly contoured portions 60, 62 are defined by curves having a radius of curvature at least as great as the radius of curvature of the pivots 44, 46 and preferably greater, for effectively displacing the connector 14 with relatively little effort. Also, the convexly contoured portions 60, 62 preferably extend 90 degrees. Such a tool 10 having object-connecting arms 32, 34 extending at an obtuse angle of about 135 degrees from the lever arms 20, 22 may be advantageously employed to separate assemblies comprising one or more moveable interconnected objects and devices by pushing or pulling on the handl member 54 with relatively little effort.

Thus, the tool 10 shown in FIGS. 1 and 2 is particularly useful for separating objects such as connector 14 from other devices such as device 12 having multiple contacts between them which present a distributed high holding force. The cross member 52 is longer than the object-contacting arms 32, 34 so that the pivots 44, 46 and convexly contoured portions 60, 62 are widely spaced for linearly extracting the connector 14. Preferably the convexly contoured portions 60, 62 contact opposite ends of the flange 16 as shown. Where a small amount of potentially bending forces can be tolerated, the tool 10 need not contact the flange at opposite ends. Also, an extraction tool embodying the invention which has only one lever arm 20 and one object-contacting arm 32 may be advantageously employed where the contacts between the connector, such as connector 14, and the device holding the connector, such as device 12, either have high strength or are not tightly so that the tool can be centrally located between or on one side of the connections (not shown).

The operation of the tool 10 is shown in FIGS. 3 and 4. FIG. 3 shows the tool 10 as it is initially inserted in the space between the flanged connector 14 and the device 12 holding it. Preferably, the tool 10 at least partly fits in the space with pivots 44, 46 and the object-contacting arms 32, 34 in contact with the device 12 while the convexly contoured portions 60, 62 of the object-contacting arms 32, 34 contact the side of the flange 16 facing the device 12.

FIG. 3 generally shows a tool 10 which is somewhat oversized and therefore causes the connector 14 to move away from the device 12 when the object-contacting arms 32, 34 originally were inserted. Thus, a guide 64 of the connector 14 can be seen extending into a sleeve 66 mounted on the device 12.

FIG. 4 generally shows the relationship of the tool 10 after the tool 10 has been rotated (clockwise) in the FIGS. 3 and 4) about its pivots 44, 46. Thus the object-contacting arms 32, 34 no longer contact the side 48 of the device 12 although the lever arms 20, 22 may in a maximum stroke contact the side 48 of the device 12.

By configuring the object-contacting arms 32, 34 with convexly contoured portions 60, 62 extending up to about 90 degrees, the tool 10 can be at least partly inserted into any space and sliding contact can be maintained with the connector 14 for quick action with only limited rotation of the lever arms 20, 22, which normally are designed to operate at a mechanical advantage. A technician would normally use the tool 10 shown in FIGS. 3 and 4 by pushing on the handle member 54 with the palm of his (or her) hand. A connector 14 would normally be extracted from another connector 14 (not shown) by holding one connector and then pulling on the hand member 54 instead of pushing upon it.

While a presently preferred embodiment of the present invention has been shown and described, it is to be distinctly understood that the invention is not limited thereto but may be otherwise variously embodied within the scope of the following claims.

What is claimed is:

1. An extraction tool to be inserted between a device and an object held by the device for extracting the object from the device, the tool comprising:

a pair of interconnected spaced apart generally parallel lever arms having first ends for imparting an extracting force to the object;

spaced-apart generally parallel object-contacting arms obtusely extending from first ends adjacent the first ends of the lever arms to distal ends, the distal ends having convexly contoured portions for contacting an object to be extracted from a device;

pivots, defined by a curve on said parallel lever arms, adjacent the first ends of the lever arms and the first ends of the object-contacting arms, the pivots and the convexly contoured portions of the distal ends of the object-contacting arms being one piece, for contacting the device holding the object while the distal ends of the object-contacting arms are in contact with the object; and a cross member extending along a line between the lever arms adjacent the pivots for maintaining the object-contacting arms in stable parallel spaced apart relationship.

2. The extraction tool of claim 1, wherein a handle member transversely extends between the lever arms generally parallel with the cross member.

3. The extraction tool of claim 1, wherein the pivots and the convexly contoured portions of the distal ends ar defined by curves having radii of curvature and the radius of curvature of the convexly contoured portions of the distal ends is at least as great as the radius of curvature of the pivots.

4. The extraction tool of claim 3, wherein the object-contacting arms extend from the lever arms at an obtuse angle of about 135 degrees.

5. The extraction tool of claim 4, wherein the convexly contoured portions of the object-contacting arms extend about 90 degrees.

6. The extraction tool of claim 1, wherein the cross member is longer than each object-contacting arm.

7. The extraction tool of claim 6, wherein the lever arms have distal ends and a handle member transversely extends between the distal ends of the lever arms.

* * * * *